United States Patent [19]

Ikeda et al.

[11] 4,440,735

[45] Apr. 3, 1984

[54] PROCESS FOR PRODUCTION OF PHOTOCONDUCTIVE CADMIUM SULFIDE

[75] Inventors: Takeshi Ikeda, Tokyo; Atsuko Yamamoto, Komae; Masanao Kasai, Kawasaki, all of Japan

[73] Assignee: Canon Kabushiki Kaisha, Tokyo, Japan

[21] Appl. No.: 340,460

[22] Filed: Jan. 18, 1982

[30] Foreign Application Priority Data

Jan. 28, 1981 [JP] Japan .................................. 56-10966

[51] Int. Cl.[3] ...................... H01C 31/00; C01B 17/00; H01L 31/00; H01B 1/06

[52] U.S. Cl. .......................... 423/561 B; 252/301.6 S

[58] Field of Search .............. 423/561 B; 252/301.6 S

[56] References Cited

U.S. PATENT DOCUMENTS

| | | | |
|---|---|---|---|
| 3,704,232 | 11/1972 | Frey et al. | 252/301.6 S |
| 3,743,609 | 7/1973 | Hirata et al. | 423/561 B |
| 4,021,237 | 5/1977 | Kawashima et al. | 423/561 B |
| 4,090,983 | 5/1978 | Akaoka | 423/561 B |
| 4,197,122 | 4/1980 | Kawashima et al. | 423/561 B |
| 4,254,093 | 3/1981 | Faria et al. | 423/561 B |

FOREIGN PATENT DOCUMENTS

| | | | |
|---|---|---|---|
| 2549181 | 5/1976 | Fed. Rep. of Germany | 423/561 B |

*Primary Examiner*—Gary P. Straub

*Attorney, Agent, or Firm*—Fitzpatrick, Cella, Harper & Scinto

[57] ABSTRACT

A process for production of photoconductive cadmium sulfide is characterized in that a flux is added to cadmium sulfide in an amount of at least 20 weight percent based on the cadmium sulfide, and the resulting mixture is fired at a temperature higher than the melting point of said flux by at least 50° C.

3 Claims, No Drawings

PROCESS FOR PRODUCTION OF PHOTOCONDUCTIVE CADMIUM SULFIDE

BACKGROUND OF THE INVENTION

1. Field of the Invention

The present invention relates to a process for production of photoconductive cadmium sulfide, in particularly, to a process for production of photoconductive cadmium sulfide having high crystallinity, uniformity, and singleness.

2. Description of the Prior Art

Heretofore, photoconductive cadmium sulfide (CdS) used typically for electrophotografic material has most generally produced by a process which comprises precipitating cadmium sulfide particles by reaction of hydrogen sulfide with water-soluble salts of cadmium such as cadmium sulfate, cadmium chloride, and the like, and firing the resulting cadmium sulfide particles at a high temperature in order to add impurity to them. In other words, photoconductive cadmium sulfide are generally prepared by mixing cadmium sulfide particles with activating agents such as $CuCl_2$, $CuSO_4$, and the like, and flux such as $CdCl_2$, $ZnCl_2$, and the like, followed by firing so that cadmium sulfide is doped with Cu, Cl, etc.

However, in the above-mentioned conventional process, CdS prepared through the firing step has a number of defects in the vicinity of surface thereof upon precipitating.

Since the surface defects act as trapping level for photocarriers, photomemory of CdS increases, namely, photoresponse rate thereof is slowed down. When a photoconductive member prepared by use of such CdS is used for high-speed copying machine, electrostatic contrast between light portion and dark portion is insufficient.

Further, CdS particles prepared by the above-mentioned process are comprised of secondary particles, namely, strong aggregates formed by aggregating particles. Such secondary particles are comprised of conglomerates in which primary particles are three-dimentionally aggregated, and plates in which primary particles are two-dimentionally aggregated. The size of the large secondary particles ranges from ten and severl microns to several tens microns.

A photoconductive member prepared by use of CdS containing a number of such large size particules has an inferior surface and produces rough images which are insufficient in resolving power. In addition, when an insulating layer is provided on the above-mentioned photoconductive member, the insulating layer can insufficiently penetrate into the CdS layer. Therefore, it is difficult to prepare an excellent photoconductive member.

SUMMARY OF THE INVENTION

It is an object of the present invention to provide a process for production of CdS capable of solving the above-mentioned drawbacks of the conventional process and forming images having high contrast even at initial image formation.

It is another object of the present invention to provide a process for production of CdS particles having a uniform form, good resolving power, and excellent capability for coating because of singleness of the particles.

It is a further object of the present invention to provide a process for production of CdS having good characteristics such as resistivity against humidity, temperature, and the like.

According to the present invention, there is a process for production of photoconductive cadmium sulfide, characterized in that a flux is added to cadmium sulfide in an amount of at least 20 weight percent based on the cadmium sulfide, and the resulting mixture is fired at a temperature higher than the melting point of said flux by at least 50° C.

DESCRIPTION OF THE PREFERRED EMBODIMENTS

CdS prepared by the process of the present invention has high crystallinity and is composed of single particles having smooth surfaces. It is observed by scanning electron microscope that each of particles is individually separated without aggregating. In other words, CdS prepared through firing according to the present invention has scarcely crystal defect capable of acting as trapping level for photocarriers in the vicinity of surfaces thereof. Therefore, when a highspeed copying machine is manufactured by using a photoconductive member prepared in such a way that such CdS particles are dispersed in a binder for electrophotography, followed by coating the dispersion on a substrate so as to prepare a photoconductive layer, if necessary, an insulating layer is laid on the photoconductive layer, images having high contrast can be obtained. Further, the obtained images have very excellent quality because of high closeness and smoothness of the coating surface of the photoconductive layer formed. The high closeness and smoothness are caused by uniformity in form and sharpness in particle size distribution.

Fluxes used in the present invention are ones used generally upon diffusing an activator into CdS. Typical fluxes include one such as $CdCl_2$, $ZnCl_2$, KCl, NaCl, $NH_4Cl$, $CdSO_4$, and the like or a mixture thereof in a suitable ratio.

A preferred mixture is one of $CdCl_2$ and an alkali metal chloride. Typical alkali metal chlorides include NaCl and KCl. The content of alkali metal chlorides is preferably an amount of from 90 mol % to 10 mol % based on the whole flux.

In the present invention, the flux is present in an amount of at least 20%, preferably 30–50%. When the flux is used in an amount less than 20%, CdS particles are sintered to produce conglomeration and to produce CdS having heterogeneous surface form, insufficient capability of charge-retaining, and poor resolving power. In addition, when firing is carried out at a temperature not reaching a level high than 50° C. over of the melting point of the flux, the resulting CdS particles have large particle size, and poor resolving power and coating capability. Electrostatic contrast in an initial image is also reduced. Further, in the process according to the present invention, a firing temperature ranges preferably up to 600° C. An amount of the flux to be added ranges preferably up to 65% based on CdS taking yield into consideration.

In the present invention, for enhancing further crystallinity, it is effective that the resulting CdS is once more fired at 400°–500° C. for annealing.

EXAMPLE 1

To 100 g of precipitated CdS raw particles without adding impurity was added $CuCl_2$ in $1\times10^{-3}$ mol ratio based on the CdS. To this mixture were added 20 g to $CdCl_2$ and 30 g of NaCl. After mixing fully, the mixture was charged into a quartz crucible, followed by firing at 530° C. for 30 minutes. (The melting point to the mixed flux of $CdCl_2$ and NaCl corresponds to the melting point of $CdCl_2.2NaCl$, 426° C., based on the constitutional diagram.) The resulting CdS had perfect hexagonal system. By an electron micrography having magnification of 10,000, it was observed that the CdS particles had very smooth surfaces and the characteristic form of hexagonal system, and that each particle was single particle of 2–5μ in size.

After dispersing the CdS thus prepared in a copolymer of vinyl chloride and vinyl acetate, the resulting dispersion was coated on an aluminum substrate in the thickness of 40μ after drying to form a photoconductive plate, and further a polyester film of 15μ thickness was attached to the photoconductive plate to produce a photoconductive member having three-layer structure. The surface of the resulting photoconductive member was very smooth.

The photoconductive member was applied to a high-speed electrophotographic process comprising primary charging, imagewise exposure simultaneous with AC discharging, and blanket exposure. The process gave excellent images based on sufficient electrostatic contrast and sensitivity. The resulting images had resolving power of at least 6 lines/mm, and was sharp. Further, after leaving the photoconductive member under the hot and humid conditions of 35° C. and 85%RH for 24 hours, images were again produced by a copying machine to produce excellent images without decrease in sensitivity and the contrast between light portion and dark portion. In addition, after leaving the photoconductive member in a copying machine for 12 hours, dark potential was measured to obtain 500 V at the first sheet and 510 V at the 50th sheet. The difference between the dark potentials was 10 V. Further, change in potential contrast measured at 5° C. and 50° C. was only 10 V.

COMPARATIVE EXAMPLE 1

The firing process in Example 1 was repeated except that the firing was carried out at 450° C. It was observed by use of electron microscope that the resulting CdS particles had comparatively smooth surface, though single particles as obtained in Example 1, which were non-aggregated, made secondary particles of at least 10μ, which were made by secondary aggregation of single particles and had complex form.

A photoconductive member with the three-layer structure was produced by using the above-mentioned CdS according to the same procedures as in Example 1. The resulting photoconductive member had a poor coating surface. Therefore, when images were formed by use of the photoconductive member and by means of the same copying machine as in Example 1, the resolving power was up to 4 lines/mm. In addition, after leaving the photoconductive member in the copying machine for 12 hours, dark potential was measured to obtain 300 V at the first sheet and 450 V at the 50th sheet. The difference between the dark potentials was 150 V.

COMPARATIVE EXAMPLE 2

The procedures in Example 1 were repeated except that a flux was prepared with 4 g of $CdCl_2$ and 6 g of NaCl. It was observed by electron microscope that the particles of the resulting CdS were not single particles, but secondary particles of ten and several microns produced by aggregation of several through several tens single particles, and that a part of primary particles was large particles produced by sintering.

A photoconductive member was produced by the above-mentioned CdS according to the same procedures as in Example 1. The resulting photoconductive member was inferior in smoothness of surface because of large primary particles or secondary aggregation. Images produced by the photoconductive member had a resolving power of up to 5 lines/mm and was rough. Also, the dark potential at the first sheet was only about 300 V.

COMPARATIVE EXAMPLE 3

The procedures in Example 1 was repeated except that a flux was prepared with 2 g of $CdCl_2$ and 3 g of NaCl. The resulting CdS was sintered. Therefore, the CdS could insufficiently be made particles in a washing step. It was observed by electron microscope that the particles were conglomerated by sintering. The resulting CdS was not useful for electrophotography.

EXAMPLE 2

To 100 g of CdS raw particles in which Cu had been already added in the ratio of $5\times10^{-4}$ mol based on CdS upon precipitating was incorporated a flux of 30 g of $CdCl_2$ and 20 g of KCl. After mixing fully, the mixture was fired at 480° C. for 30 minutes.

Thereafter, a photoconductive member was prepared by using the resulting CdS according to the same procedures as in Example 1. The photoconductive member gave the same good results as in Example 1. The melting point of the above-mentioned mixed flux corresponds to the melting point of $KCdCl_3$, 390° C., based on the constitutional diagram.

EXAMPLE 3

To 100 g of precipitated CdS raw particles free from an impurity was added $CuCl_2$ in $1\times10^{-3}$ mol ratio based on the CdS by the wet process. After adding 41 g of $CdCl_2$ and 9 g of NaCl to the above-mentioned CdS, the mixture was fully mixed to charge into a quartz crucible, followed by firing at 500° C. for 30 minutes. The resulting CdS had perfect hexagonal system. It was observed by electron micrography that the CdS particles had very smooth surface and the characteristic form of hexagonal system, and that each particle was a uniform and single particle of 3–5μ in size.

The same good results as in Example 1 were obtained by evaluation of a photoconductive member prepared by the CdS in this Example according to the same procedures as in Example 1.

What we claim is:

1. A process for production of photoconductive cadmium sulfide, characterized in that a flux is added in an amount from about 20 to 65 weight percent based on the cadmium sulfide, and the resulting mixture is fired at a temperature higher than the melting point of said flux by at least 50° C., said flux being a mixture of $CdCl_2$ and alkali metal chloride said alkali metal chloride being present in an amount from 10 mole percent to 90 mole percent, based on the total flux wherein the total alkali metal chloride present in the process is supplied solely from said flux.

2. A process for production of photoconductive cadmium sulfide according to claim 1, wherein an amount of a flux ranges from 30 to 50 weight percent based on cadmium sulfide.

3. A process for production of photoconductive cadmium sulfide according to claim 1, wherein the resulting cadmium sulfide is once more fired.

* * * * *